(12) United States Patent
Gao et al.

(10) Patent No.: US 9,385,144 B2
(45) Date of Patent: Jul. 5, 2016

(54) ARRAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Shan Gao, Beijing (CN); Fan Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 107 days.

(21) Appl. No.: 14/363,211

(22) PCT Filed: Jun. 13, 2013

(86) PCT No.: PCT/CN2013/077190
§ 371 (c)(1),
(2) Date: Jun. 5, 2014

(87) PCT Pub. No.: WO2014/172966
PCT Pub. Date: Oct. 30, 2014

(65) Prior Publication Data
US 2015/0206903 A1    Jul. 23, 2015

(30) Foreign Application Priority Data

Apr. 23, 2013 (CN) .......................... 2013 1 0143402

(51) Int. Cl.
*G02F 1/136* (2006.01)
*H01L 27/12* (2006.01)
(Continued)

(52) U.S. Cl.
CPC ............ *H01L 27/124* (2013.01); *G02F 1/1368* (2013.01); *G02F 1/136286* (2013.01); *H01L 29/42364* (2013.01); *H01L 29/42384* (2013.01); *G02F 2001/134345* (2013.01)

(58) Field of Classification Search
CPC ............ G02F 1/1368; G02F 1/136286; H01L 29/42364; H01L 29/42384
See application file for complete search history.

(56) References Cited

U.S. PATENT DOCUMENTS

2009/0086147 A1    4/2009  Chen et al.
2009/0195489 A1*   8/2009  Hung ................ G02F 1/136286
                                                            345/92
(Continued)

FOREIGN PATENT DOCUMENTS

CN    101398581 A    4/2009
CN    101526705 A    9/2009
(Continued)

OTHER PUBLICATIONS

International Search Report dated Jan. 22, 2014; PCT/CN2013/077190.
(Continued)

*Primary Examiner* — James Dudek
(74) *Attorney, Agent, or Firm* — Ladas & Parry LLP

(57) ABSTRACT

An array substrate and a display device that comprises the array substrate are disclosed. The array substrate comprises a base substrate, a plurality of scan lines (Ga, 21) and a plurality of data lines (Dr, 4) that are provided on the base substrate and intersect with each other, and a plurality of sub-pixel regions arranged evenly; sub-pixel regions in two adjacent rows are configured as one pixel row group, so that a plurality of pixel row groups are arranged longitudinally, and between two rows of sub-pixel regions within each of the pixel row groups and/or between every two adjacent pixel row groups, there are provided two scan lines (Ga, 21), which overlap in partial (22b) and are insulated from each other; or, sub-pixel regions in two adjacent columns are configured as one pixel column group, so that a plurality of pixel column groups are arranged transversely, and between two columns of sub-pixel regions within each of the pixel column groups or between every two adjacent pixel column groups, there are provided two data lines (Dr), which overlap in partial and are insulated from each other. The array substrate has a relatively high aperture ratio.

12 Claims, 11 Drawing Sheets

(51) Int. Cl.
*G02F 1/1362* (2006.01)
*G02F 1/1368* (2006.01)
*H01L 29/423* (2006.01)
*G02F 1/1343* (2006.01)

(56) References Cited

U.S. PATENT DOCUMENTS

2010/0245735 A1   9/2010   Xie et al.
2011/0090140 A1*  4/2011   Kim .................... G02F 1/13624
                                                       345/87
2014/0362323 A1* 12/2014   Nakano ............. G02F 1/136213
                                                       349/46

FOREIGN PATENT DOCUMENTS

| CN | 101540329 A | 9/2009 |
| CN | 101847640 A | 9/2010 |
| CN | 102881689 A | 1/2013 |
| KR | 20070082240 A | 8/2007 |

OTHER PUBLICATIONS

First Chinese Office Action dated Jan. 26, 2015; Appln. No. 201310143402.2.
Second Chinese Office Action dated Jul. 3, 2015; Appln. No. 201310143402.2.
Written Opinion of the International Searching Authority Appln. No. PCT/CN2013/077190; Dated Jan. 30, 2014.
Third Chinese Office Action Appln. No. 201310109108.X; Dated Aug. 18, 2015.
International Preliminary Report on Patentability Appln. No. PCT/CN2013/077190; Dated Oct. 27, 2015.

* cited by examiner

A—A

ARRAY SUBSTRATE AND DISPLAY DEVICE

TECHNICAL FIELD

Embodiments of the present invention relate to an array substrate and a display device that comprises the array substrate.

BACKGROUND

Liquid crystal displays have characteristics of small volume, low power consumption, low radiation and so on, and thus have played a leading role in the market for flat panel displays at present. In the technical field of liquid crystal display, Thin film transistor liquid crystal displays (TFT-LCDs) have been widely applied to televisions, computers, mobile phones and other fields with the advantages of high integration, various functions, flexible process, low cost, etc.

A TFT-LCD is usually formed in such a way that an array substrate and a color filter substrate that have been manufacture are assembled together by cell-aligning and liquid crystals are filled therebetween, and it generally adopts a row-column matrix driving mode. As illustrated in FIG. 1, thin film transistors within sub-pixel regions in each row are charged sequentially by scan lines (also referred to as gate lines) and data lines disposed on the array substrate, so as to present colors; each of the sub-pixel regions comprises one thin film transistor, the gate electrodes of thin film transistors in sub-pixel regions in each of rows are connected to the same scan line, the source electrodes of them are connected to different data lines, and one scan line is disposed between every two adjacent rows of sub-pixel regions. In FIG. 1, "Gan" represents the nth scan line, "Drn" represents the nth data line, n is a positive integer greater than 1, M represents a thin film transistor, and M11 represents a thin film transistor that is connected to the first scan line and the first data line, respectively.

Among various parameters of the TFT-LCD, aperture ratio is an important factor that affects the screen brightness and power consumption. Aperture ratio refers to the ratio of the area of a portion that allows light to pass through in each sub-pixel region except the wirings and the thin film transistor to the overall area of the sub-pixel region. The higher the aperture ratio is, the higher the light transmittance is, and on the condition of the same backlight source, the brightness of the screen will become higher. Because the power consumption of a backlight source in a TFT-LCD takes up 60% or so of the overall power output, increasing of the aperture ratio can reduce power consumption of the backlight source on the premise of satisfying the screen brightness. Thereby, power consumption of the whole TFT-LCD is reduced. Therefore, how to increase the aperture ratio further more in the case of process conditions permitting becomes an urgent issue to be solved in the industry.

SUMMARY

According to embodiments of the invention, there are provided an array substrate with a higher aperture ratio and a display device that comprises the array substrate.

In an aspect of the invention, there is provided an array substrate, comprising a base substrate, a plurality of scan lines and a plurality of data lines that are provided on the base substrate and intersect with each other, and a plurality of sub-pixel regions arranged evenly, each of which comprises one thin film transistor; sub-pixel regions in two adjacent rows are configured as one pixel row group, so that a plurality of pixel row groups are arranged longitudinally, and between two rows of sub-pixel regions within each of the pixel row groups and/or between every two adjacent pixel row groups, there are provided two scan lines, each of which is electrically connected to gate electrodes of thin film transistors within one of sub-pixel regions of the two rows of sub-pixel regions that are adjacent to them, respectively, and these two scan lines overlap in partial and are insulated from each other so as to decrease the landing area occupied by them on the base substrate; or, sub-pixel regions in two adjacent columns are configured as one pixel column group, so that a plurality of pixel column groups are arranged transversely, and between two columns of sub-pixel regions within each of the pixel column groups and/or between every two adjacent pixel column groups, there are provided two data lines, each of which are electrically connected to source electrodes of thin film transistors within one of sub-pixel regions of the two columns that are adjacent to them, respectively, and the two data line overlap in partial and are insulated from each other so as to decrease the landing area occupied by them on the base substrate.

In another aspect of the invention, there is further provided a display device that comprises the above array substrate.

With respect to the array substrate according to embodiments of the invention, the aperture ratio is increased as compared to a conventional array substrate, and thus power consumption of a product is reduced on the premise that it satisfies brightness of the display device.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

Figure 1:
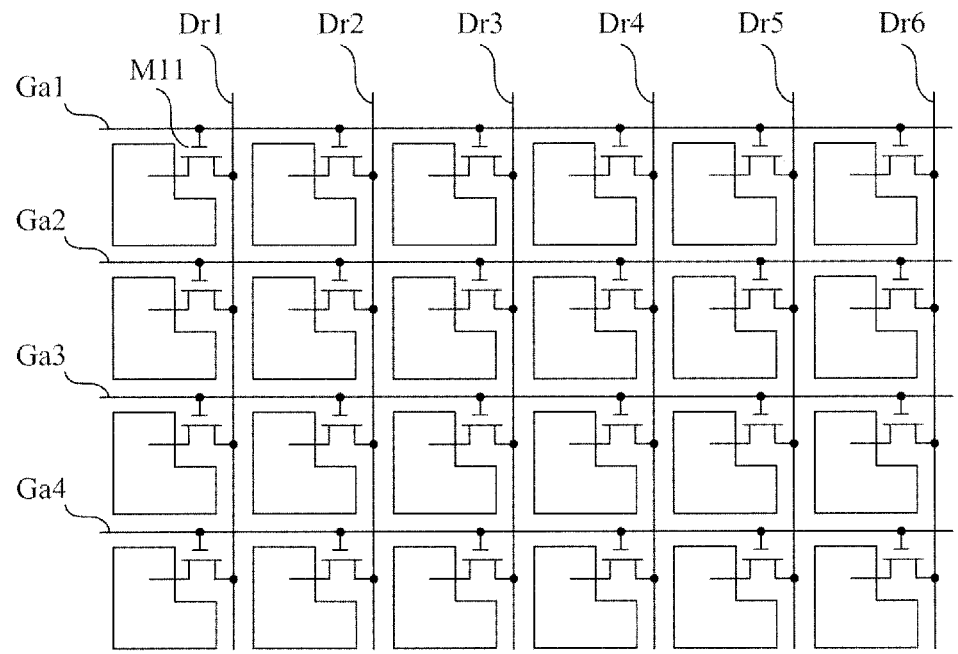
FIG. 1 is a structurally schematic view illustrating a conventional array substrate.

Reference numerals:

1 - gate electrode;  21 - first scan line;  22a - non-overlapping section;
22b - overlapping section;  22c - extension section;
3 - gate insulating layer;  4 - data line;  5 - source electrode;
6 - drain electrode;  7 - semiconductor layer;  8 - passivation layer;
9 - pixel electrode;  10 - connection layer.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) into the scope sought for protection by the invention.

Unless otherwise defined, the technical terminology or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," or "the" does not indicate limitation in number, but specifies the presence of at least one. A term "comprises," "comprising," "comprises," "including" or the like means that an element or article ahead of this term encompasses element(s) or article(s) listed behind this term and its (their) equivalents, but does not preclude the presence of other elements or articles. A term "connection," "connected," or the like is not limited to physical or mechanical connection, but can include electrical connection, whether directly or indirectly. "On," "under," "left," "right" or the like is only used to describe a relative positional relationship, and when the absolute position of a described object is changed, the relative positional relationship might also be changed accordingly.

Embodiment 1

According to the embodiment, there is provided an array substrate, comprising a base substrate, a plurality of scan lines and a plurality of data lines that are provided on the base substrate and intersect with each other, a plurality of sub-pixel regions arranged evenly, and each of the sub-pixel regions comprises a thin film transistor.

Sub-pixel regions in two adjacent rows are configured as one pixel row group, so as to form a plurality of pixel row groups arranged longitudinally; between two rows of sub-pixel regions within each of the pixel row groups and/or between every two adjacent pixel row groups, there are provided two scan lines, and each of the two scan lines is electrically connected to the gate electrodes of the thin film transistors within sub-pixel regions in the corresponding one row of the two rows of sub-pixel regions that are adjacent to the scan lines, and the two scan lines overlap each other in partial and are insulated from each other so as to decrease the landing area occupied by them on the base substrate.

Figure 2:
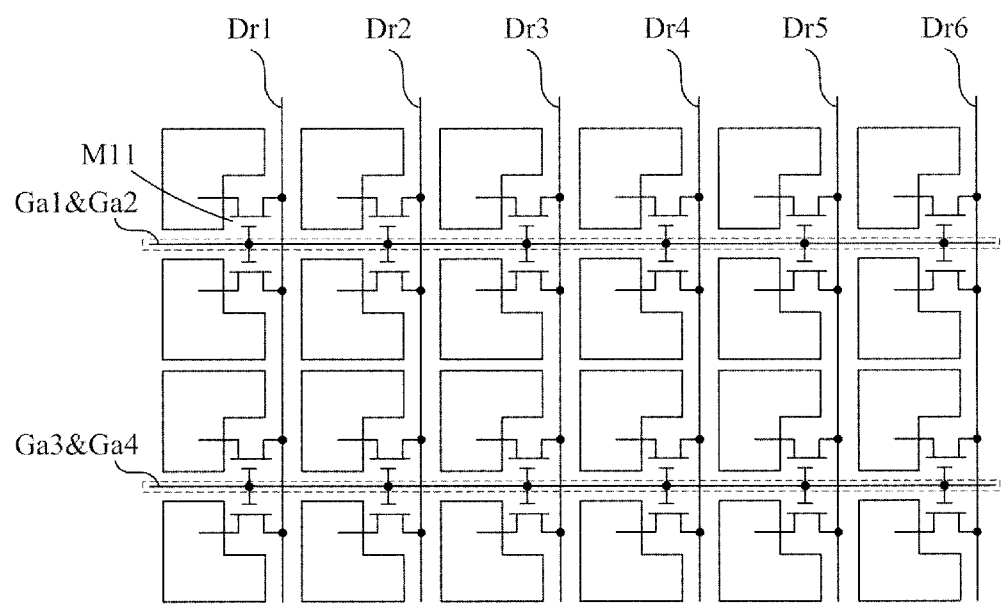
FIG. 2 is a schematic view illustrating the circuit structure of an array substrate of the first type in Embodiment 1 of the invention.
Figure 3:
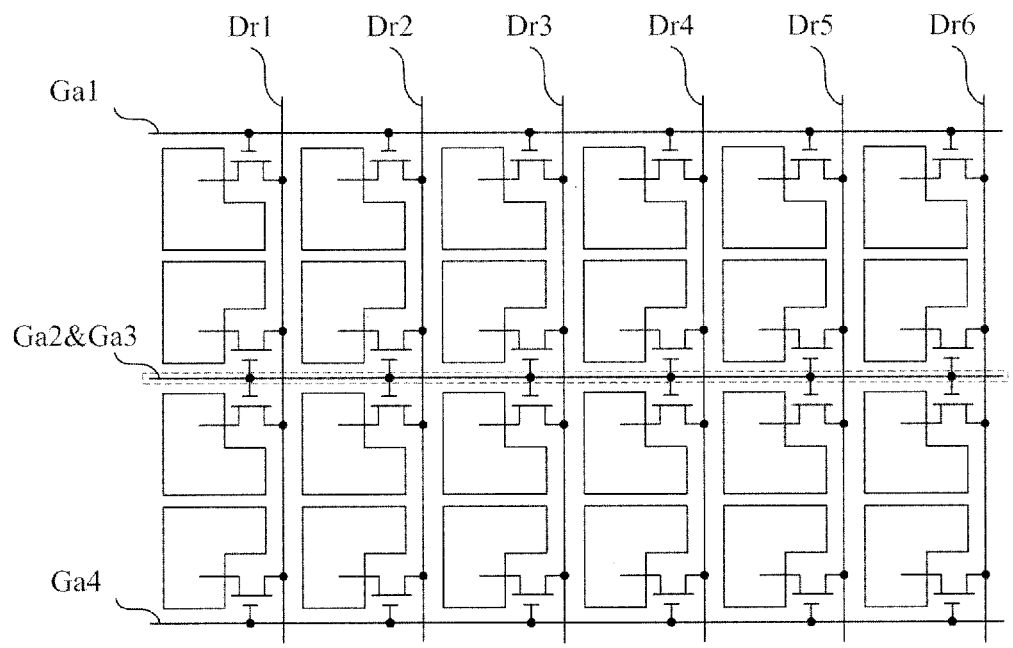
FIG. 3 is a schematic view illustrating the circuit structure of an array substrate of the second type in Embodiment 1 of the invention.
Figure 4:
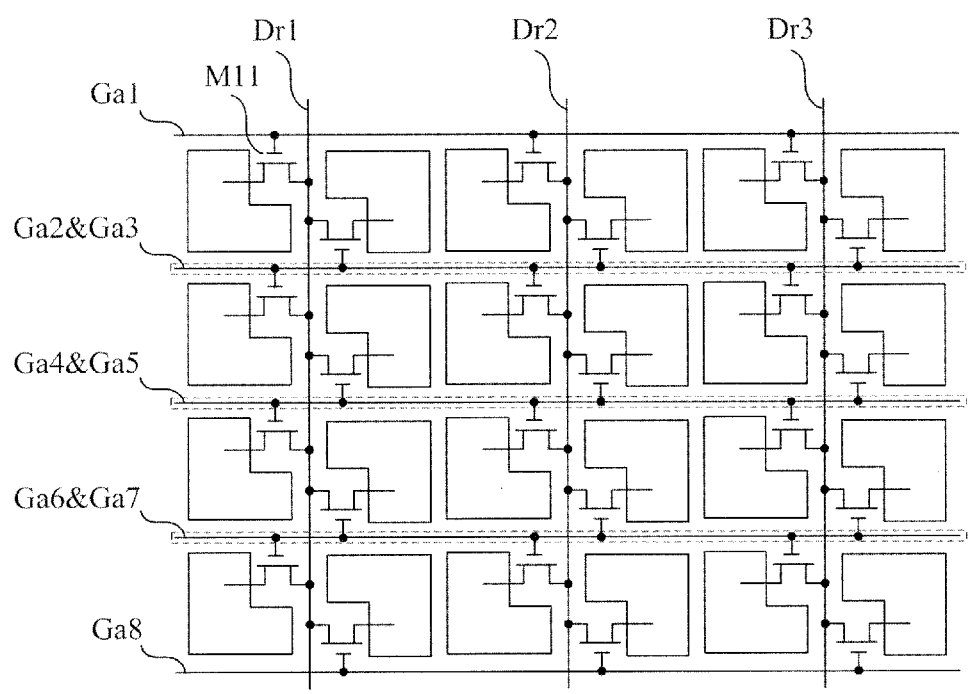
FIG. 4 is a schematic view illustrating the circuit structure of an array substrate of the third type in Embodiment 1 of the invention.

The configuration of the above array substrate will be described in detail below with reference to FIGS. 2 to 4. The configurations illustrated in FIGS. 2 to 4 are merely schematic views of the array substrate, and only a part of configurations of the array substrate are illustrated. "Gan" represents the nth scan line, "Drn" represents the nth data line, n is a positive integer greater than 1, M represents a thin film transistor, and M11 represents a thin film transistor that is connected to the first scan line and the first data line, respectively.

Between two rows of sub-pixel regions within each of the pixel row groups, there are provided two scan lines, each of which is electrically connected to gate electrodes of thin film transistors within sub-pixel regions in the corresponding one of the two rows of sub-pixel regions that are adjacent to the two scan lines, and the source electrodes of thin film transistors within sub-pixel regions in each of columns are electrically connected to the same data line. An array substrate of this configuration is illustrated in FIG. 2. In the embodiment of FIG. 2, the first row of sub-pixel regions and the second row of sub-pixel regions constitute a first pixel row group, and the third row of sub-pixel regions and the fourth row of sub-pixel regions constitute a second pixel row group; a first scan line Ga1 and a second scan line Ga2 are provided between the first row of sub-pixel regions and the second row of sub-pixel regions in the first pixel row group, and a third scan line Ga3 and a fourth scan line Ga4 are provided between the third row of sub-pixel regions and the fourth row of sub-pixel regions in the second pixel row group; the first scan line Ga1 and the second scan line Ga2 overlap with each other in partial and are insulated from each other, and the third scan line Ga3 and the fourth scan line Ga4 overlap with each other in partial and are insulated from each other.

The configuration of the array substrate in the embodiment illustrated in FIG. 3 differs from that in FIG. 2 in that, two scan lines are provided between every two adjacent pixel row groups. For example, between a first pixel row group and a second pixel row group, there are provided a second scan line Ga2 and a third scan line Ga3, which overlap with each other in partial and are insulated from each other.

As can be seen that, when array substrates in embodiments illustrated in FIG. 2 and FIG. 3 are compared with conventional array substrates, a decrease of the landing area occupied by one half of scan lines on the base substrate is realized, and aperture ratio is raised greatly.

Between two rows of sub-pixel regions within each of pixel row groups and between every two adjacent pixel row groups, there are provided two scan lines (namely, two scan lines are provided between every two adjacent rows of sub-pixel regions), each of which is electrically connected to gate electrodes of thin film transistors within sub-pixel regions in the corresponding one of the two rows of sub-pixel regions that are adjacent to the two scan lines. Sub-pixel regions in two adjacent columns are configured as one pixel column group, so as to form a plurality of pixel column groups arranged transversely; between two columns of sub-pixel regions within each of the pixel column groups, there is provided one data line, and source electrodes of thin film transistors within all sub-pixel regions in the pixel column group are electrically connected to the data line. An array substrate with this configuration is illustrated in FIG. 4. In FIG. 4, the first row of sub-pixel regions and the second row of sub-pixel regions constitute a first pixel row group, and the third row of sub-pixel regions and the fourth row of sub-pixel regions constitute a second pixel row group; a second scan line Ga2 and a third scan line Ga3 are provided between the first row of sub-pixel regions and the second row of sub-pixel regions in the first pixel row group, a fourth scan line Ga4 and a fifth scan line Ga5 are provided between the first pixel row group and the second pixel row group, and a sixth scan line Ga6 and a seventh scan line Ga7 are provided between the third row of sub-pixel regions and the fourth row of sub-pixel regions in the second pixel row group; the second scan line Gat and the third scan line Ga3, the fourth scan line Ga4 and the fifth scan line Ga5, and the sixth scan line Ga6 and the seventh scan line Ga7 overlap in partial and are insulated from each other, respectively.

As can be seen that, by means of increasing the number of scan lines, the number of data lines is decreased in the array substrate in the embodiment illustrated in FIG. 4, and compared with the array substrate, such as the configuration illustrated in FIG. 1, the number of data lines is decreased by half. For example, sub-pixel regions in six columns in FIG. 1 need six data lines, while sub-pixel regions in six columns in FIG. 4 merely need three data lines, and thus the size and/or number of data-line drive ICs connected to the data lines are decreased accordingly in the embodiment. Because the price of a data-line drive IC is much more expensive than the price of a scan-line drive IC, the production cost is greatly reduced by the array substrate illustrated in FIG. 4 compared with a conventional array substrate. Furthermore, two scan lines between two adjacent rows of sub-pixel regions in the array substrate illustrated in FIG. 4 overlap with each other in partial and are insulated from each other, and therefore, the landing area occupied by scan lines on the base substrate is decreased, and is almost the same as the landing area occupied by scan lines in a conventional array substrate.

Preferably, the two scan lines provided between two rows of sub-pixel regions within each of the pixel row groups and/or between every two adjacent pixel row groups are, respectively, a first scan line electrically connected to gate electrodes of all thin film transistors within sub-pixel regions in one row of the two rows of sub-pixel regions that are adjacent to the two scan lines, and a second scan line electrically connected to gate electrodes of all thin film transistors within sub-pixel regions in another row of the two rows of sub-pixel regions that are adjacent to the two scan lines. That is, the first scan line corresponds to all thin film transistors within sub-pixel regions in one row of the two rows of sub-pixel regions that are adjacent to the two scan lines, and the second scan line corresponds to all thin film transistors within sub-pixel regions in another row of the two rows of sub-pixel regions that are adjacent to the two scan lines.

For example, the first scan line and the gate electrodes of thin film transistors corresponding to it are located in the same layer and formed from the same film layer.

Each of sub-pixel regions of the array substrate comprises a pixel electrode, and then the array substrate also comprises a plurality of pixel electrodes, each of which is electrically connected to a drain electrode of one thin film transistor. The plurality of data lines, the plurality of scan lines and the plurality of pixel electrodes are mutually insulated from each other.

For example, the second scan line comprises an overlapping section and a non-overlapping section. The overlapping section is a portion of the second scan line that overlaps with the first scan line, and the overlapping section and a data line or a pixel electrode are located in the same layer and formed from the same film layer. The non-overlapping section is a portion of the second scan line that does not overlap with the first scan line and electrically connected to a gate electrode of a thin film transistor corresponding to the second scan line, and the non-overlapping section and the gate electrode of the thin film transistor corresponding to the second scan line are located in the same layer and formed from the same film layer.

The overlapping section and the non-overlapping section in the second scan line are electrically connected, so as to form a continuous scan line capable of transmitting signals.

As can be seen that, a part of the second scan line and a gate electrode of a thin film transistor corresponding to the part are located in the same layer and formed from the same film layer and does not overlap the first scan line (i.e., the non-overlapping section), and another part of the second scan line and a data line or pixel electrode are located in the same layer and formed from the same film layer and overlaps the first scan line (i.e., the overlapping section). In the array substrate, insulating layers (such as a gate insulating layer or a passivation layer) are provided between the data line and pixel electrode and the layer where the gate electrode of the thin film transistor is located, and hence an insulating layer is also provided between the overlapping section of the second scan line and the first scan line, so that the overlapping section can overlap the first scan line fully without conduction between each other; furthermore, an insulating layer is also provided between the overlapping section and the non-overlapping section of the second scan line, so that electrical connection between the overlapping section and the non-overlapping section only can be realized by way of providing a via hole in the insulating layer, etc. In view of the fact that there are many methods for realizing electrical connection between the overlapping section and the non-overlapping section, implementation method of the electrical connection can be elected by those skilled in the related art according to an actual wiring requirements on an array substrate, details thereof being omitted here.

Preferably, different components formed from the same film layer are formed by the same patterning process, or may also be formed by different patterning processes according to actual requirements. For example, the overlapping section and the data line or pixel electrode are formed from the same film layer, and then the overlapping section not only can be formed by the same patterning process as the data line, but also can be formed by the same patterning process as the pixel electrode. Thus, from the standpoint of forming process, forming components from the same film layer results in neither addition of process steps of an array substrate, nor change in substance of a multilayered structure of the array substrate, and the implementation is simple.

The following embodiments 2 to 8 will be described with reference to an example in which the landing area occupied by scan lines on a base substrate is decreased, i.e. the two scan lines overlap in partial and are insulated from each other.

Alternatively, between two columns of sub-pixel regions within each of pixel column groups or between every two adjacent pixel column groups, there are provided two data lines, each of which is electrically connected to source electrodes of thin film transistors within sub-pixel regions in corresponding one of two columns of sub-pixel regions that are adjacent to them, and the two data lines overlap in partial and are insulated from each other so as to decrease the landing area occupied by them on a base substrate.

Preferably, gate electrodes of thin film transistors within sub-pixel regions in each row are electrically connected to the same scan line. When an array substrate with this structure is compared to a conventional array substrate, a decrease of the landing area occupied by one half of data lines on the base substrate is realized, and aperture ratio is raised greatly.

According to the embodiment, there is further provided a display device that comprises the above array substrate.

Embodiment 2

In the embodiment, the second scan line comprises a plurality of overlapping sections and a plurality of non-overlapping sections. The overlapping sections and data lines are located in the same layer and formed from the same film layer; and every two adjacent overlapping sections are located on two sides of one of the data lines. Projection of each of the non-overlapping sections on a base substrate intersects with projection of one data line on the base substrate, and each of the non-overlapping sections is electrically connected to a gate electrode of one thin film transistor corresponding to the second scan line. The plurality of overlapping sections and the plurality of non-overlapping sections are disposed alternately; and each overlapping section in the second scan line is electrically connected to a non-overlapping section adjacent to it.

According to the embodiment, there is further provided a display device that comprises the above array substrate.

Other structures and functions in the embodiment are the same as those in the Embodiment 1, and details thereof are omitted here.

Embodiment 3

The embodiment differs from Embodiment 2 in that, the second scan line further comprises a plurality of extension sections, each of which is a portion that extends from one overlapping section to overlap with one non-overlapping section adjacent to it, and the number of the extension sections is twice as many as the number of the non-overlapping sections. The array substrate further comprises a gate insulating layer, which is provided between the first scan line as well as the plurality of non-overlapping sections of the second scan line and the plurality of overlapping section as well the plurality of extension sections of the second scan line. A plurality of via holes are provided in the gate insulating layer, and each of them corresponds to the location of one extension section so that each of the extension sections is electrically connected to one non-overlapping section through a via hole. Thus, this enables each overlapping section in the second scan line to be electrically connected to a non-overlapping section adjacent to it, respectively.

Preferably, the array substrate further comprises a passivation layer that covers the gate insulating layer, and data lines, source electrodes, drain electrodes and semiconductor layers of thin film transistors, and the plurality of extension sections and the plurality of overlapping sections of the second scan line. A plurality of via holes is provided on the passivation layer, and each of them corresponds to the location of a drain electrode of one thin film transistor. The plurality of pixel electrodes is disposed on the passivation layer, and each of them is electrically connected to a drain electrode of one thin film transistor through one via hole in the passivation layer.

Figure 5:
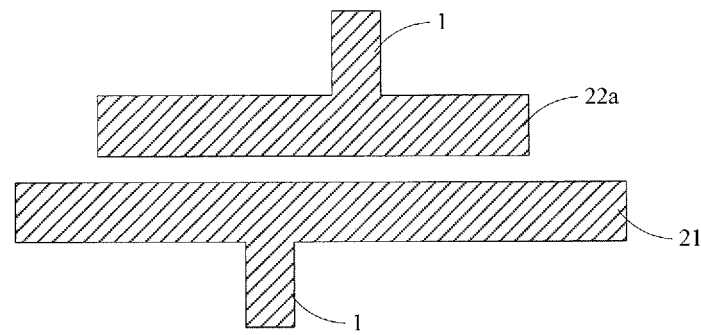
FIG. 5 is a schematic view illustrating the plane structure of an array substrate after complete of step s101 in Embodiment 3 of the invention.
Figure 6:
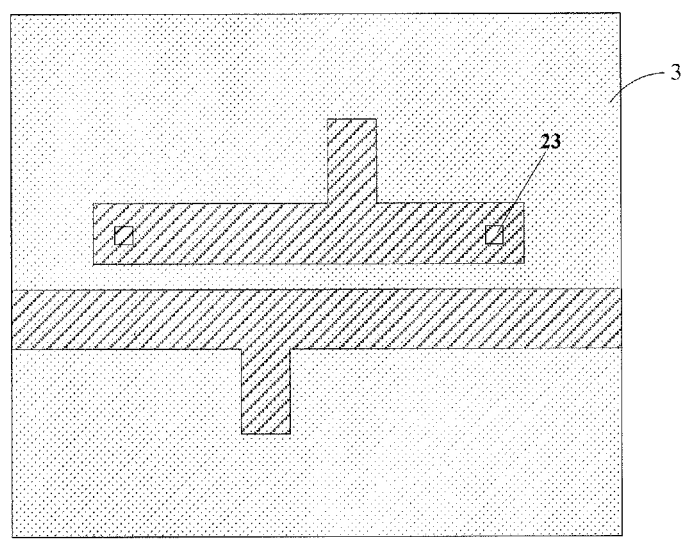
FIG. 6 is a schematic view illustrating the plane structure of an array substrate after complete of step s102 in Embodiment 3 of the invention.
Figure 7:
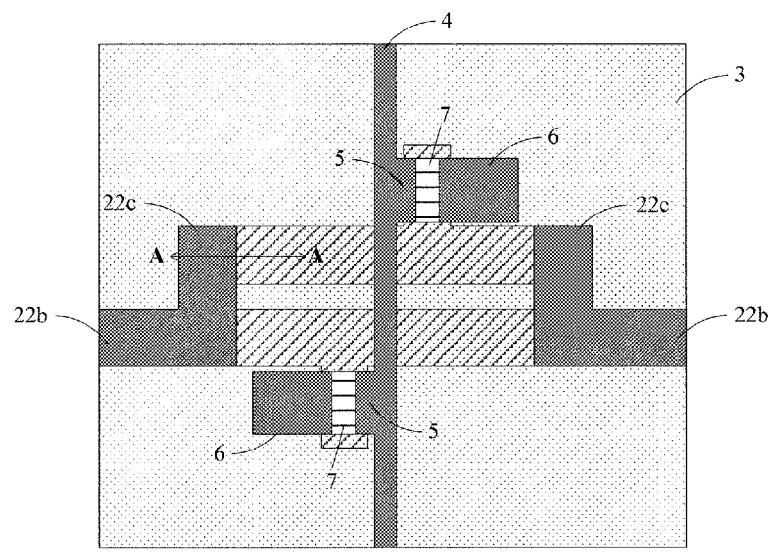
FIG. 7 is a schematic view illustrating the plane structure of an array substrate after complete of step s103 in Embodiment 3 of the invention.
Figure 8:
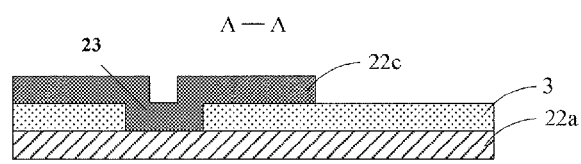
FIG. 8 is an A-A sectional view of FIG. 7.
Figure 9:
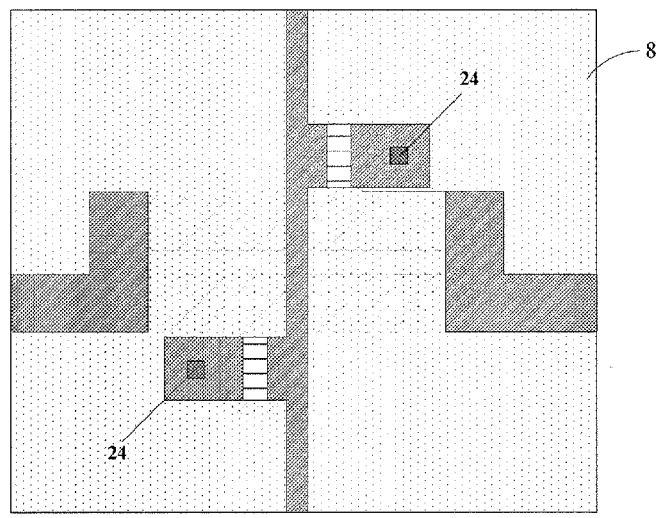
FIG. 9 is a schematic view illustrating the plane structure of an array substrate after complete of step s104 in Embodiment 3 of the invention.
Figure 10:
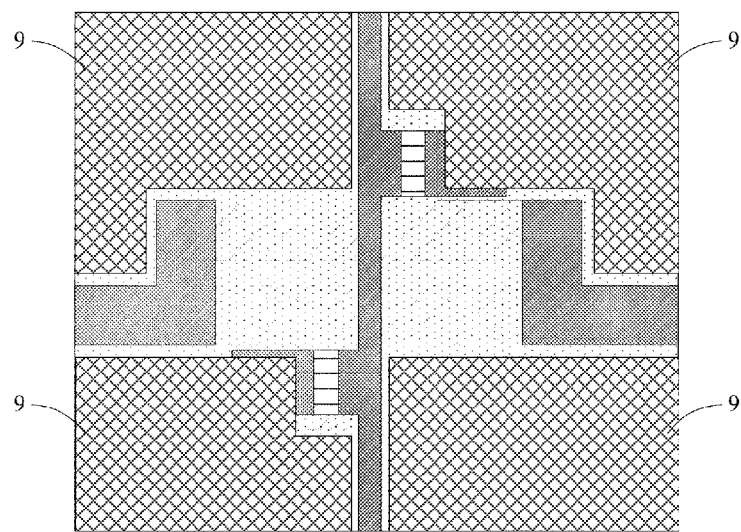
FIG. 10 is a schematic view illustrating the plane structure of an array substrate after complete of step s105 in Embodiment 3 of the invention.

A manufacturing method of the array substrate according to the embodiment will be given below with reference to the structure illustrated in FIG. 4 as an example, and it comprises the following steps.

s100, a base substrate is provided.

s101, as illustrated in FIG. 5, the patterns of a first scan line 21, a non-overlapping section 22a of a second scan line, and gate electrodes 1 are formed on the base substrate (not illustrated in the figure); the first scan line 21 is electrically connected to gate electrodes of all thin film transistors corresponding to the first scan line, and the non-overlapping section 22a is electrically connected to the gate electrode of one thin film transistor corresponding to the second scan line.

s102, as illustrated in FIG. 6, a pattern of a gate insulating layer 3 is formed on the base substrate subjected to step s101, and a plurality of via holes 23 are formed in the gate insulating layer 3; the number of the via holes 23 is twice as many as the number of the non-overlapping sections 22a, and every two via holes 23 correspond to locations of two ends of one non-overlapping section 22a, respectively.

s103, as illustrated in FIG. 7 and FIG. 8, by using a Half Tone Mask (HTM) or Gray Tone Mask (GTM) technology, patterns of overlapping sections 22b of the second scan line, extension sections 22c, a data line 4, source electrodes 5, drain electrodes 6 and semiconductor layers 7 are formed on the base substrate subjected to step s102. Every two adjacent overlapping sections 22b are located on two sides of one data line 4, that is, the overlapping sections 22b and the data line 4 are disposed alternately. Projection of each non-overlapping section 22a on the base substrate intersects with projection of one data line 4 on the base substrate, and each of the extension sections 22c covers one of the via holes 23 in the gate insulating layer. As can be seen that, each of the overlapping sections 22b of the second scan line is electrically connected to a non-overlapping section 22c adjacent to the overlapping section 22b through an extension section 22c and a via hole 23 formed in the gate insulating layer 3, so as to form a structure in which the second scan line and the first scan line overlap with each other in partial and are insulated from each other, and the wiring resistance is relative small.

s104, as illustrated in FIG. 9, a pattern of a passivation layer 8 is formed on the base substrate subjected to step s103, and a plurality of via holes 24 are formed in the passivation layer; the number of the via holes 24 is the same as the number of thin film transistors, and each of the via holes 24 corresponds to the location of a drain electrode 6 of one thin film transistor.

s105, as illustrated in FIG. 10, a pattern of pixel electrodes 9 is formed on the base substrate subjected to step s104; the number of pixel electrodes 9 is the same as the number of thin film transistors, and each of the pixel electrodes 9 is electrically connected to the drain electrode 6 of one thin film transistor through one via hole 24 on the passivation layer 8.

It is to be noted that, the gate insulating layer 3 and the passivation layer 8 in every schematic view of a planar structure involved in the present disclosure are subjected to a semi-transparent treatment, so as to facilitate the observation for the number and location of via holes formed on the two layers.

According to the embodiment, there is further provided a display device that comprises the above array substrate.

Other structures and functions in the present embodiment are the same as those in the Embodiment 2, and details thereof are omitted here.

Embodiment 4

The embodiment differs from Embodiment 2 in that, the second scan line further comprises a plurality of extension sections, each of which is a portion that extends from one overlapping section to overlap with one non-overlapping section adjacent to it, and the number of the extension sections is twice as many as the number of the non-overlapping sections. The array substrate further comprises a gate insulating layer and a passivation layer. The gate insulating layer is disposed between the first scan line as well as a plurality of non-overlapping sections of the second scan line and the plurality of overlapping section as well as the plurality of extension sections of the second scan line; and on the gate insulating layer, there provided a plurality of via holes, each of which is close to one extension section and corresponds to the location of a non-overlapping section close to the extension section. The passivation layer covers the gate insulating layer, the plurality of overlapping sections and the plurality of extension sections of the second scan line; a plurality of first via holes and a plurality of second via holes are provided in the passivation layer. Each of the first via hole corresponds to the location of one via hole in the gate insulating layer, and each of the second via hole corresponds to the location of one extension section.

The array substrate further comprises a connection layer, which is located in the same layer as a pixel electrode and formed from the same film layer as the pixel electrode, and the connection layer and the pixel electrode are insulated from each other. The connection layer covers all of the first via holes and the second via holes in the passivation layer and all via holes in the gate insulating layer, so that each of the extension sections is electrically connected to one non-overlapping section through the connection layer. Thus, this enables each overlapping section in the second scan line to be electrically connected to a non-overlapping section adjacent to it, respectively.

Figure 11:
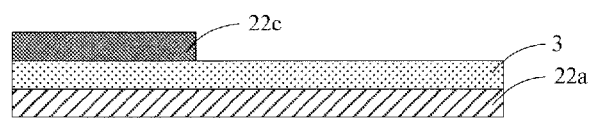
FIG. 11 is an A-A sectional view illustrating an array substrate after complete of step s202 in Embodiment 4 of the invention.
Figure 12:
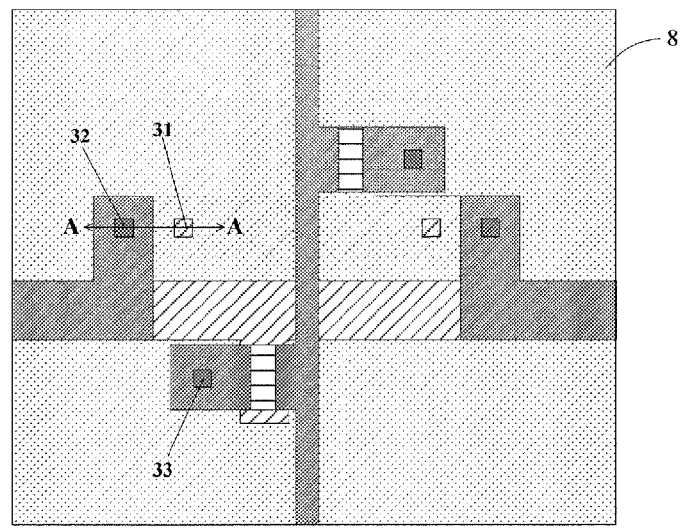
FIG. 12 is a schematic view illustrating the plane structure of an array substrate after complete of step s203 in Embodiment 4 of the invention.
Figure 13:
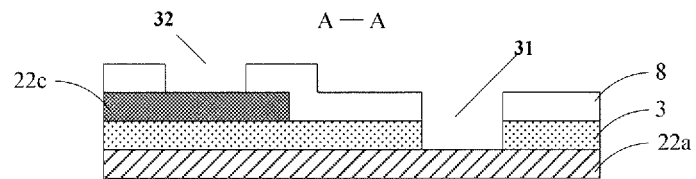
FIG. 13 is an A-A sectional view of FIG. 12.
Figure 14:
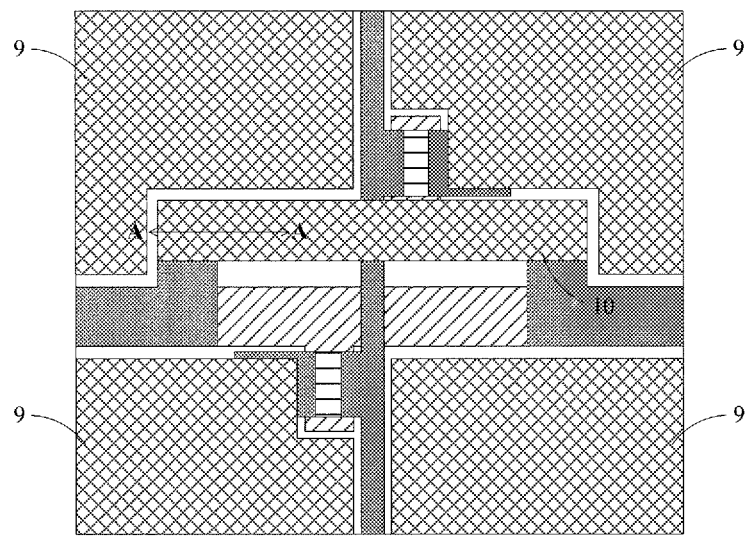
FIG. 14 is a schematic view illustrating the plane structure of an array substrate after complete of step s204 in Embodiment 4 of the invention.
Figure 15:
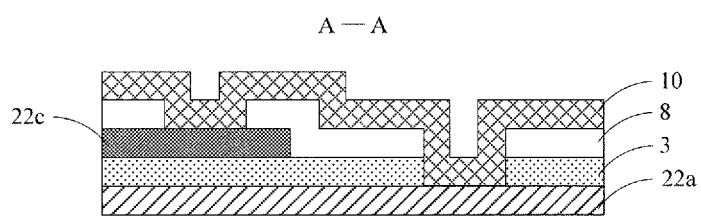
FIG. 15 is an A-A sectional view of FIG. 14.

A manufacturing method of the array substrate according to the embodiment will be given below with reference to the structure illustrated in FIG. 4 as an example, and it comprises the following steps.

s200, a base substrate is provided.

s201, patterns of a first scan line 21, a non-overlapping section 22a of a second scan line, and gate electrodes 1 are formed on the base substrate; the first scan line 21 is electrically connected to gate electrodes of all thin film transistors corresponding to it, and the non-overlapping section 22a is electrically connected to the gate electrode of one thin film transistor corresponding to the second scan line. The schematic view of the planar structure of the array substrate subjected to the step is the same as FIG. 5.

s202, by using a Half Tone Mask or Gray Tone Mask technology, patterns of a gate insulating layer 3, overlapping sections 22b of the second scan line, extension sections 22c, a data line 4, source electrodes 5, drain electrodes 6 and semiconductor layers 7 is formed on the base substrate subjected to step s201. Every two adjacent overlapping sections 22b are located on two sides of one data line 4, that is, the overlapping sections 22b and the data line 4 are disposed alternately. Projection of each non-overlapping section 22a on the base substrate intersects with projection of one data line 4 on the base substrate. The schematic view of a planar structure of the array substrate subjected to the step is the same as FIG. 7, and its A-A sectional view is illustrated in FIG. 11.

s203, as illustrated in FIG. 12 and FIG. 13, a pattern of a passivation layer 8 is formed on the base substrate subjected to step s202, and a plurality of via holes are formed in the passivation layer 8 and the gate insulating layer 3, respectively; each of the via holes formed in the gate insulating layer 3 is close to one extension section 22c and corresponds to the location of a non-overlapping section 22a close to the extension section. The plurality of via holes formed in the passivation layer 8 are first via holes 31, second via holes 32 and third via holes 33, respectively, each of the first via holes 31 corresponds to the location of one via hole in the gate insulating layer, each of the second via holes 32 corresponds to the location of one extension section 22c, and each of the third via holes 33 corresponds to the location of a drain electrode 6 of one thin film transistor.

s204, as illustrated in FIG. 14 and FIG. 15, patterns of pixel electrodes 9 and a connection layer 10 is formed on the base substrate subjected to step s203; the number of pixel electrodes 9 is the same as the number of thin film transistors, and each of the pixel electrodes 9 is electrically connected to the drain electrode 6 of one thin film transistor through one of the third via holes in the passivation layer 8. The connection layer 10 covers all of the first via holes and the second via holes in the passivation layer 8 and all via holes in the gate insulating layer, so that each overlapping section 22b of the second scan line is electrically connected to the non-overlapping section 22a adjacent to it through the connection layer 10, respectively. Thus, a structure in which the second scan line and the first scan line overlap in partial and are insulated from each other is formed.

As can be seen that, only four patterning processes have to be employed for completion of the array substrate according to the present embodiment, and a decrease of one patterning step is realized as compared to Embodiment 3. Accordingly, the cost is saved.

According to the present embodiment, there is further provided a display device that comprises the above array substrate.

Other structures and functions in the present embodiment are the same as those in the Embodiment 2, and details thereof are omitted here.

Embodiment 5

The present embodiment differs from Embodiment 2 in that, the second scan line further comprises a plurality of extension sections, each of which is a portion that extends from one overlapping section to overlap with one non-overlapping section adjacent to it, and the number of the extension sections is twice as many as the number of the non-overlapping sections. Each of the extension sections has one via hole provided thereon. The array substrate further comprises a gate insulating layer and a passivation layer. The gate insulating layer is disposed between the first scan line as well as a plurality of non-overlapping sections of the second scan line and the plurality of overlapping sections as well as the plurality of extension sections of the second scan line; on the gate insulating layer, there are provided a plurality of via holes, each of which corresponds to the location of the via hole on one extension section. The passivation layer covers the gate insulating layer, the plurality of overlapping sections and the plurality of extension sections of the second scan line, and a plurality of via holes are provided in the passivation layer. Each of the via holes corresponds to the location of the via hole on one extension section. The array substrate further comprises a connection layer, which is located in the same layer as a pixel electrode and formed from the same film layer as the pixel electrode, and the connection layer and the pixel electrode are insulated from each other. The connection layer covers all of the via holes in the passivation layer, the via holes on all of the extension sections, and all via holes in the gate insulating layer, so that each of the extension sections is electrically connected to one non-overlapping section through the connection layer. Thus, this enables each overlapping section in the second scan line to be electrically connected to the non-overlapping section adjacent to it, respectively.

Figure 16:
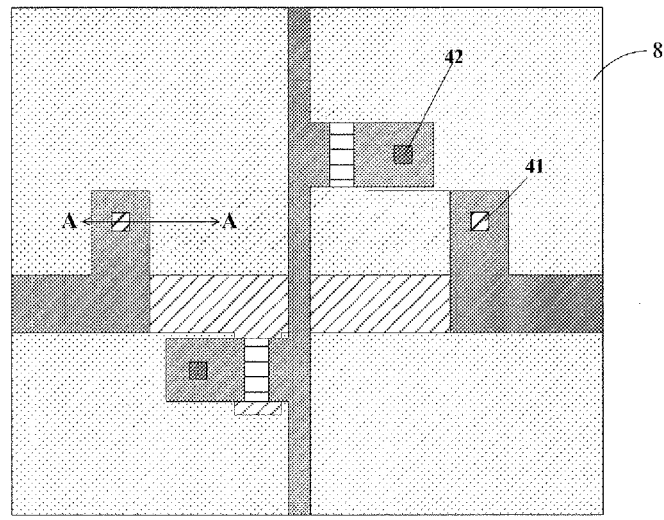
FIG. 16 is a schematic view illustrating the plane structure of an array substrate after complete of step s303 in Embodiment 5 of the invention.
Figure 17:
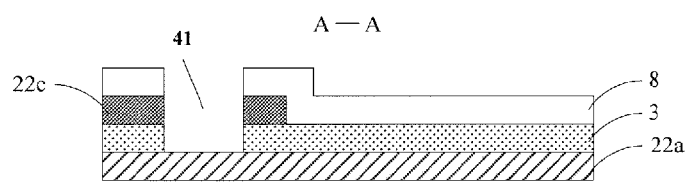
FIG. 17 is an A-A sectional view of FIG. 16.
Figure 18:
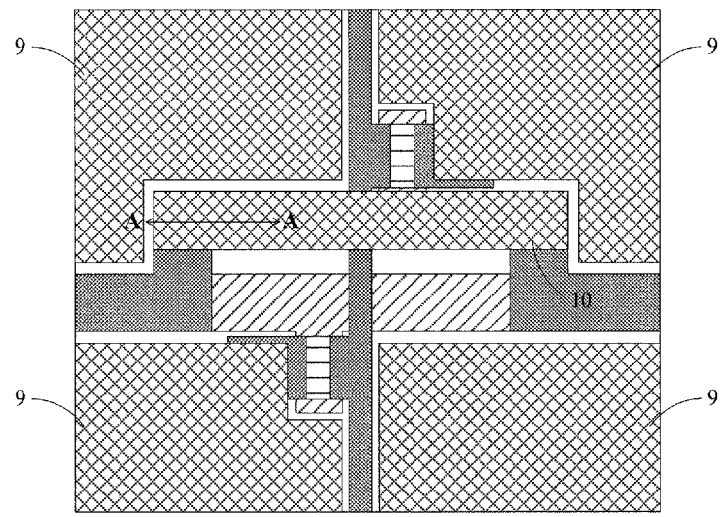
FIG. 18 is a schematic view illustrating the plane structure of an array substrate after complete of step s304 in Embodiment 5 of the invention.
Figure 19:
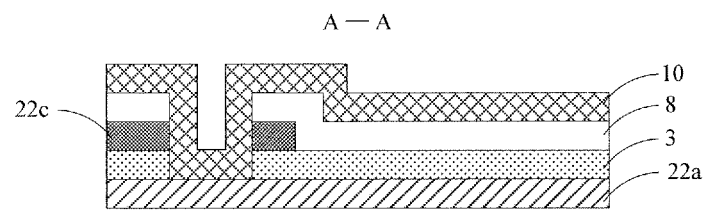
FIG. 19 is an A-A sectional view of FIG. 18.

A manufacturing method of the array substrate according to the embodiment will be given below with reference to the structure illustrated in FIG. 4 as an example, and it comprises the following steps.

s300, a base substrate is provided.

s301, patterns of a first scan line 21, a non-overlapping section 22a of a second scan line and gate electrodes 1 are formed on the base substrate; the first scan line 21 is electrically connected to the gate electrodes of all thin film transistors corresponding to the first scan line, and the non-overlapping section 22a is electrically connected to the gate electrode of one thin film transistor corresponding to the second scan line. The schematic view of the planar structure of the array substrate subjected to the step is the same as FIG. 5.

s302, by using a Half Tone Mask or Gray Tone Mask technology, patterns of a gate insulating layer 3, overlapping sections 22b of the second scan line, extension sections 22c, a data line 4, source electrodes 5, drain electrodes 6 and semiconductor layers 7 are formed on the base substrate subjected to step s301. Every two adjacent overlapping sections 22b are located on two sides of one data line 4, that is, the overlapping sections 22b and the data line 4 are disposed alternately. Projection of each non-overlapping section 22a on the base substrate intersects with projection of one data line 4 on the base substrate. The schematic view of the planar structure of the array substrate subjected to the step is the same as FIG. 7, and its A-A sectional view is illustrated in FIG. 11.

s303, as illustrated in FIG. 16 and FIG. 17, a pattern of a passivation layer 8 is formed on the base substrate subjected to step s302, and a plurality of via holes are formed in the passivation layer 8 and the gate insulating layer 3 and in the extension sections 22c, respectively; on each of the extension sections 22c, there is formed one via hole, which corresponds to one via hole in the gate insulating layer 3. A plurality of via holes is formed in the passivation layer 8 and comprise first via holes 41 and second via holes 42, respectively. Each of the first via holes 41 corresponds to the location of one via hole in the gate insulating layer (namely, it corresponds to the location of one extension section 22c), and each of the second via holes 32 corresponds to the location of a drain electrode 6 of one thin film transistor.

s304, as illustrated in FIG. 18 and FIG. 19, patterns of pixel electrodes 9 and a connection layer 10 are formed on the base substrate subjected to step s303; the number of pixel electrodes 9 is the same as the number of thin film transistors, and each of the pixel electrodes 9 is electrically connected to the drain electrode 6 of one thin film transistor through one of the second via holes 42 in the passivation layer 8. The connection layer 10 covers all of the first via holes 41 in the passivation layer 8, via holes on all of the extension sections 22c and all via holes in the gate insulating layer 3, so that each overlapping section 22b in the second scan line is electrically connected to a non-overlapping section 22a adjacent to it through the connection layer 10, respectively. Thus, a structure in which the second scan line and the first scan line overlap in partial and are insulated from each other is formed.

According to the present embodiment, there is further provided a display device that comprises the above array substrate.

Other structures and functions in the present embodiment are the same as those in the Embodiment 2, and details thereof are omitted here.

Embodiment 6

The present embodiment differs from Embodiment 2 in that, the array substrate further comprises a gate insulating layer and a passivation layer. The gate insulating layer is disposed between the first scan line as well as a plurality of non-overlapping sections of the second scan line and the plurality of overlapping sections of the second scan line; on the gate insulating layer, there are provided a plurality of via holes, each of which corresponds to the location of one end of one non-overlapping section that is close to an overlapping section adjacent to it. The passivation layer covers the gate insulating layer and the plurality of overlapping sections of the second scan line, and a plurality of first via holes and a plurality of second via holes are provided in the passivation layer. Each of the first via holes corresponds to the location of one via hole in the gate insulating layer, and each of the second via holes corresponds to the location of one end of one overlapping section that is close to a non-overlapping section adjacent to the overlapping section. The array substrate further comprises a connection layer, which is located in the same layer as a pixel electrode and formed from the same film layer as it, and the connection layer and the pixel electrode are insulated from each other. The connection layer covers all of the first via holes and the second via holes in the passivation layer, and all via holes in the gate insulating layer, so that each overlapping section in the second scan line is electrically connected to a non-overlapping section adjacent to it through the connection layer, respectively.

Figure 20:
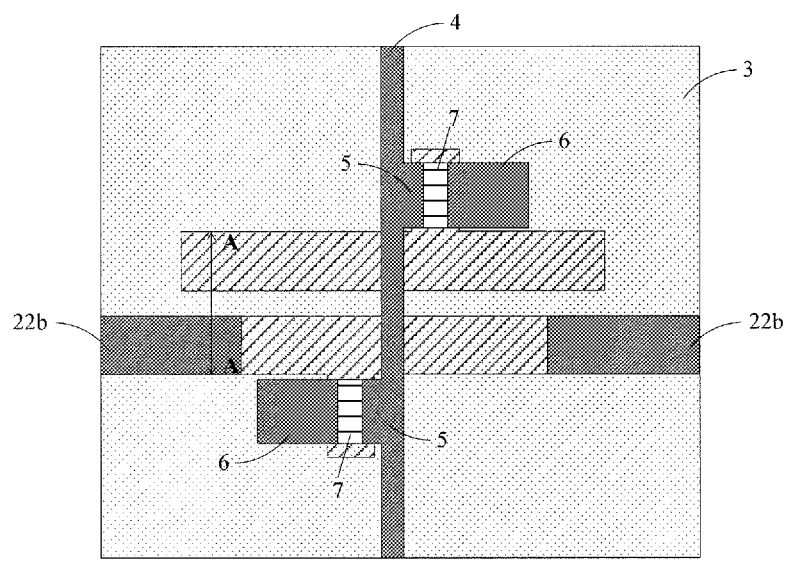
FIG. 20 is a schematic view illustrating the plane structure of an array substrate after complete of step s402 in Embodiment 6 of the invention.
Figure 21:
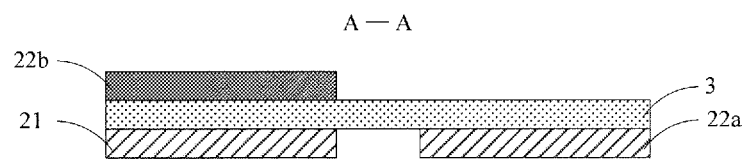
FIG. 21 is an A-A sectional view of FIG. 20.
Figure 22:
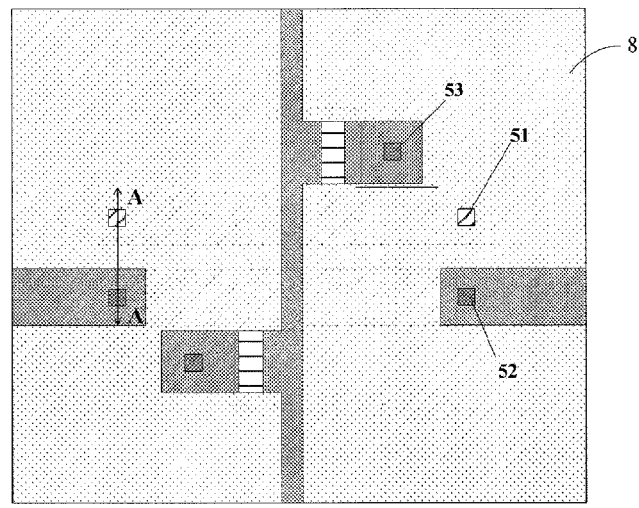
FIG. 22 is a schematic view illustrating the plane structure of an array substrate after complete of step s403 in Embodiment 6 of the invention.
Figure 23:
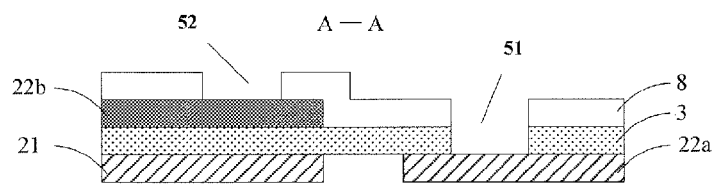
FIG. 23 is an A-A sectional view of FIG. 22.
Figure 24:
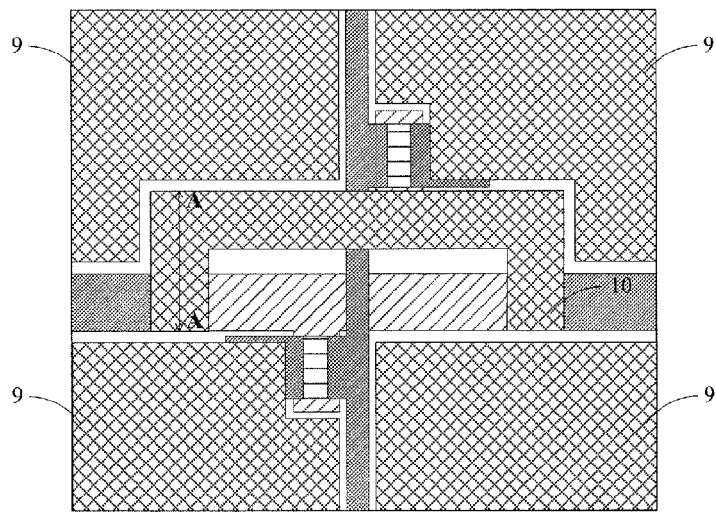
FIG. 24 is a schematic view illustrating the plane structure of an array substrate after complete of step s404 in Embodiment 6 of the invention.
Figure 25:
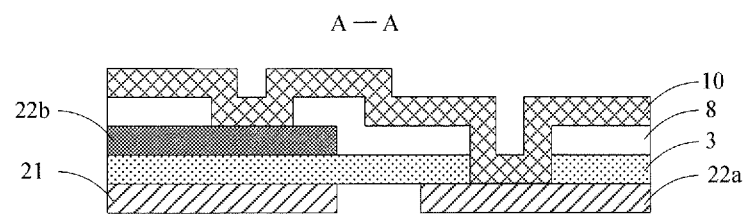
FIG. 25 is an A-A sectional view of FIG. 24.

A manufacturing method of the array substrate according to the embodiment will be given below with reference to the structure illustrated in FIG. 4 as an example, and it comprises the following steps.

s400, a base substrate is provided.

s401, patterns of a first scan line 21, a non-overlapping section 22a of a second scan line and gate electrodes 1 are formed on the base substrate; the first scan line 21 is electrically connected to gate electrodes of all thin film transistors corresponding to the first scan line, and the non-overlapping sections 22a are electrically connected to gate electrodes of one thin film transistor corresponding to the second scan line. The schematic view of the planar structure of the array substrate subjected to the step is the same as FIG. 5.

s402, as illustrated in FIG. 20 and FIG. 21, by using a Half Tone Mask or Gray Tone Mask technology, patterns of a gate insulating layer 3, overlapping sections 22b of the second scan line, a data line 4, source electrodes 5, drain electrodes 6 and semiconductor layers 7 are formed on the base substrate subjected to step s401. Every two adjacent overlapping sections 22b are located on two sides of one data line 4, that is, the overlapping sections 22b and the data line 4 are disposed alternately. Projection of each non-overlapping section 22a on the base substrate intersects with projection of one data line 4 on the base substrate.

s403, as illustrated in FIG. 22 and FIG. 23, a pattern of a passivation layer 8 is formed on the base substrate subjected to step s402, and a plurality of via holes are formed in the passivation layer 8 and the gate insulating layer 3, respectively; each of the via holes formed in the gate insulating layer 3 corresponds to the location of one end of a non-overlapping section 22a that is close to an overlapping section 22b adjacent to it. The plurality of via holes formed in the passivation layer 8 are first via holes 51, second via holes 52 and third via holes 53, respectively. Each of the first via holes 51 corresponds to the location of one via hole in the gate insulating layer 3, each of the second via holes 52 corresponds to the location of one end of one overlapping section 22b that is close to a non-overlapping section 22a adjacent to it, and each of the third via holes 53 corresponds to the location of a drain electrode 6 of one thin film transistor.

s404, as illustrated in FIG. 24 and FIG. 25, patterns of pixel electrodes 9 and a connection layer 10 are formed on the base substrate subjected to step s403; the number of pixel electrodes 9 is the same as the number of thin film transistors, and each of the pixel electrodes 9 is electrically connected to the drain electrode 6 of one thin film transistor through one of the third via holes in the passivation layer 8. The connection layer 10 covers all of the first via holes 51 and the second via holes 52 in the passivation layer 8, and all via holes in the gate insulating layer, so that each overlapping section 22b in the second scan line is electrically connected to a non-overlapping section 22a adjacent to it through the connection layer 10, respectively. Thus, a structure in which the second scan line and the first scan line overlap in partial and are insulated from each other is formed.

According to the present embodiment, there is further provided a display device that comprises the above array substrate.

Other structures and functions in the present embodiment are the same as those in the Embodiment 2, and details thereof are omitted here.

Embodiment 7

In the present embodiment, an overlapping section of the second scan line and a pixel electrode are located in the same layer and formed from the same film layer. The overlapping section is one in number, and its length is the same as the length of a first scan line. The non-overlapping sections are in plurality, and each of non-overlapping sections is electrically connected to a gate electrode of one thin film transistor corresponding to the second scan line, namely, the number of non-overlapping sections is the same as the number of thin film transistors corresponding to the second scan line. The overlapping section in the second scan line is electrically connected to all of the non-overlapping sections simultaneously.

According to the present embodiment, there is further provided a display device that comprises the above array substrate.

Other structures and functions in the present embodiment are the same as those in the Embodiment 1, and details thereof are omitted here.

Embodiment 8

The present embodiment differs from. Embodiment 7 in that, each of non-overlapping sections of the second scan line is electrically connected to a gate electrode of one thin film transistor corresponding to the second scan line. The second scan line further comprises a plurality of extension sections, each of which is a portion that extends from the overlapping section to overlap with one non-overlapping section adjacent to it, and the number of the extension sections is twice as many as the number of the non-overlapping sections. The array substrate further comprises a gate insulating layer and a passivation layer. The gate insulating layer covers the first scan line and a plurality of non-overlapping sections of the second scan line, and has a plurality of via holes provided therein, each of which corresponds to the location of one extension section. The passivation layer covers the gate insulating layer, and has a plurality of via holes provided therein, each of which corresponds to the location of one via hole in the gate insulating layer. Both the overlapping section and the plurality of extension sections are disposed in the passivation layer, so that each of the extension sections is electrically connected to one non-overlapping section. Thus, this enables the overlapping section in the second scan line to be electrically connected to non-overlapping sections adjacent to it, respectively.

Figure 26:
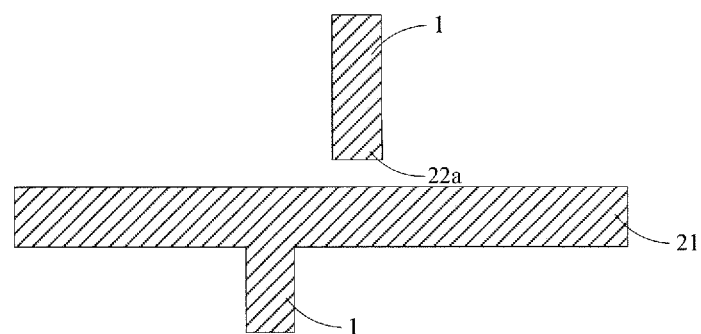
FIG. 26 is a schematic view illustrating the plane structure of an array substrate after complete of step s501 in Embodiment 8 of the invention.
Figure 27:
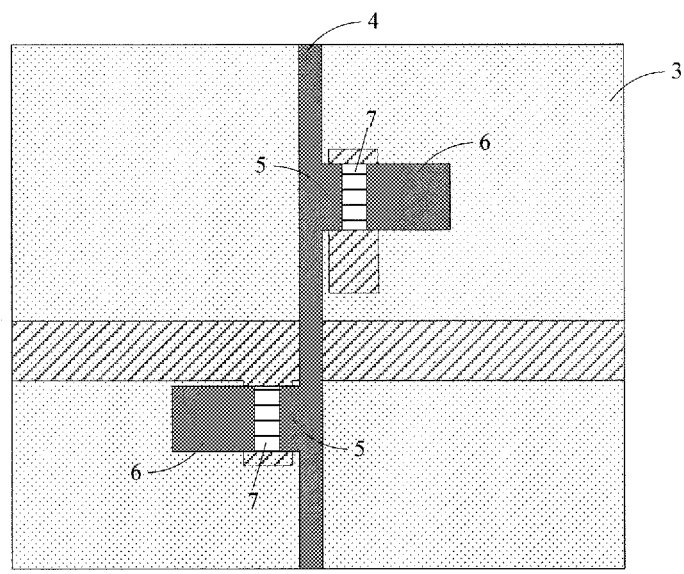
FIG. 27 is a schematic view illustrating the plane structure of an array substrate after complete of step s502 in Embodiment 8 of the invention.
Figure 28:
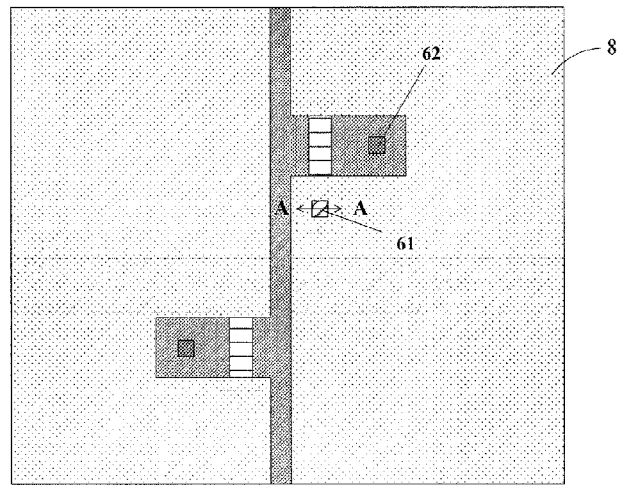
FIG. 28 is a schematic view illustrating the plane structure of an array substrate after complete of step s503 in Embodiment 8 of the invention.
Figure 29:
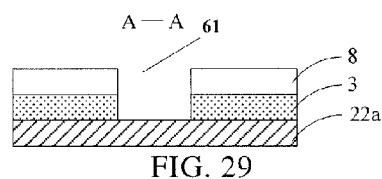
FIG. 29 is an A-A sectional view of FIG. 28.
Figure 30:
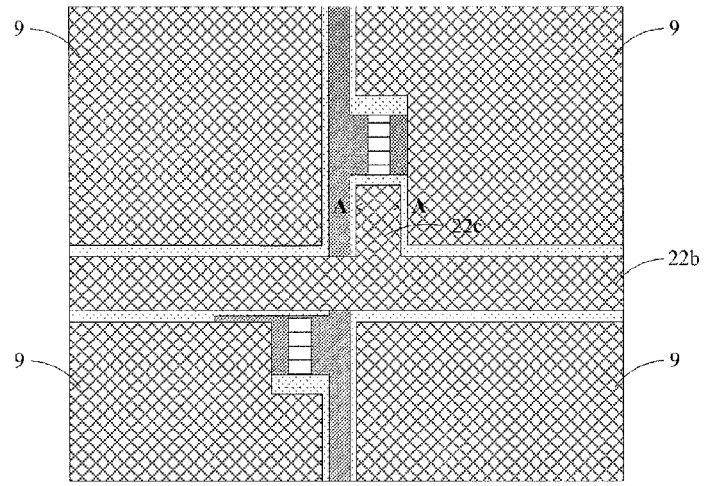
FIG. 30 is a schematic view illustrating the plane structure of an array substrate after complete of step s504 in Embodiment 8 of the invention.
Figure 31:
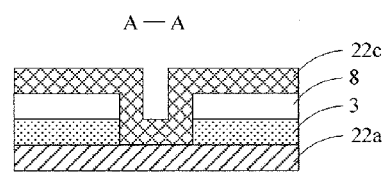
FIG. 31 is an A-A sectional view of FIG. 30.

A manufacturing method of the array substrate according to the present embodiment will be given below with the structure illustrated in FIG. 4 as an example, and it comprises the following steps.

s500, a base substrate is provided.

s501, as illustrated in FIG. 26, patterns of a first scan line 21, a non-overlapping section 22a of a second scan line and gate electrodes 1 are formed on the base substrate; the first scan line 21 is electrically connected to gate electrodes of all thin film transistors corresponding to the first scan line, and the non-overlapping sections 22a are electrically connected to gate electrodes of one thin film transistor corresponding to the second scan line.

s502, as illustrated in FIG. 27, by using a Half Tone Mask or Gray Tone Mask technology, patterns of a gate insulating layer 3, a data line 4, source electrodes 5, drain electrodes 6 and semiconductor layers 7 are formed on the base substrate subjected to step s501.

s503, as illustrated in FIG. 28 and FIG. 29, a pattern of a passivation layer 8 is formed on the base substrate subjected to step s502, and a plurality of via holes are formed in the passivation layer 8 and the gate insulating layer 3, respectively; each of the via holes formed in the gate insulating layer 3 corresponds to the location of the non-overlapping section 22a, and the plurality of via holes formed in the passivation layer 8 comprise first via holes 61 and second via holes 62, respectively. Each of the first via holes 61 corresponds to the location of one via hole in the gate insulating layer 3 (namely, it corresponds to the location of one non-overlapping section 22a), and each of the second via holes 62 corresponds to the location of a drain electrode 6 of one thin film transistor.

s504, as illustrated in FIG. 30 and FIG. 31, patterns of pixel electrodes 9, an extension section 22c and an overlapping section 22b of the second scan line is formed on the base substrate subjected to step s503; the number of pixel electrodes 9 is the same as the number of thin film transistors, and each of the pixel electrodes 9 is electrically connected to the drain electrode 6 of one thin film transistor through one of the second via holes 42 in the passivation layer 8. The overlapping section 22b corresponds to the location of the first scan line 21. Each of the extension sections 22c corresponds to the location of a non-overlapping section 22a, and covers one via hole in the gate insulating layer 3 corresponding to it, and one of first via holes in the passivation layer corresponding to it, so that the overlapping section 22b in the second scan line is electrically connected to the non-overlapping sections 22a adjacent to it, respectively. Thus, a structure in which the second scan line and the first scan line overlap in partial and are insulated from each other is formed, and the wiring resistance is relatively small.

According to the present embodiment, there is further provided a display device that comprises the above array substrate.

Other structures and functions in the present embodiment are the same as those in the Embodiment 7, and details thereof are omitted here.

In summary, two examples of increasing the aperture ratio are given in array substrates according to embodiments of the invention:

One is to provide two scan lines between two rows of sub-pixel regions within each of pixel row groups and/or between every two adjacent pixel row groups, and the two scan lines overlap partially and are insulated from each other, so that the landing area occupied by scan lines on a base substrate is effectively decreased.

The other is to provide two data lines between two columns of sub-pixel regions within each of pixel column groups or between every two adjacent pixel column groups, and the two data lines overlap partially and are insulated from each other, so that the landing area occupied by data lines on a base substrate is effectively decreased.

Descriptions made above are merely exemplary embodiments of the invention, but are not used to limit the protection scope of the invention. The protection scope of the invention is determined by attached claims.

The invention claimed is:

1. An array substrate, comprising a base substrate, a plurality of scan lines and a plurality of data lines that are provided on the base substrate and intersect with each other, and a plurality of sub-pixel regions arranged evenly, each of which comprises one thin film transistor, wherein sub-pixel regions in two adjacent rows are configured as one pixel row group, so that a plurality of pixel row groups are arranged longitudinally, and two scan lines are provided in at least one of Position A and Position B, Position A being between two rows of sub-pixel regions within each of the pixel row groups, Position B being between every two adjacent pixel row groups, each of which is electrically connected to gate electrodes of thin film transistors within one of sub-pixel regions of the two rows of sub-pixel regions that are adjacent to them, respectively, and these two scan lines overlap in partial and are insulated from each other;

wherein each of the sub-pixel regions further includes a pixel electrode;

the two scan lines are a first scan line and a second scan line, respectively;

the first scan line and gate electrodes of thin film transistors corresponding to the first scan line are located in a same layer;

the second scan line comprises at least one overlapping section and at least one non-overlapping section; the overlapping section is a portion of the second scan line that overlaps the first scan line, and the overlapping section and a data line or the pixel electrode are located in a same layer; the non-overlapping section is a portion of the second scan line that does not overlap the first scan line, and is electrically connected to a gate electrode of a thin film transistor corresponding to the second scan line, and the non-overlapping section and the gate electrode of the thin film transistor corresponding to the second scan line are located in a same layer;

the overlapping section and the non-overlapping section of the second scan line are electrically connected so as to provide a continuous scan line capable of transmitting signals.

2. The array substrate claimed as claim 1, wherein between two rows of sub-pixel regions within each of the pixel row groups or between every two adjacent pixel row groups, there are provided two scan lines; and source electrodes of thin film transistors within sub-pixel regions in each of columns are electrically connected to a same data line.

3. The array substrate claimed as claim 1, wherein between two rows of sub-pixel regions within each of the pixel row groups and between every two adjacent pixel row groups, there are provided two scan lines; between two columns of sub-pixel regions within each pixel column group, there is provided one data line, and source electrodes of thin film transistors within all sub-pixel regions in the pixel column group are electrically connected to the one data line.

4. The array substrate claimed as claim 1, wherein the second scan line comprises a plurality of overlapping sections and a plurality of non-overlapping sections, the overlapping sections and data lines are located in a same layer, every two adjacent overlapping sections 22b are located on two sides of one of the data lines, projection of each non-overlapping section on the base substrate intersects with projection of one data line on the base substrate; the plurality of overlapping sections and the plurality of non-overlapping sections are disposed alternately; and each overlapping section of the second scan line is electrically connected to a non-overlapping section adjacent to the overlapping section.

5. The array substrate claimed as claim 4, wherein the second scan line further include a plurality of extension sections, each of which is a portion that extends from one overlapping section to overlap with one non-overlapping section adjacent to the overlapping section, and a number of the extension sections is twice as many as a number of the non-overlapping sections.

6. The array substrate claimed as claim 5, further comprising a gate insulating layer, which is disposed between the first scan line as well as the plurality of non-overlapping sections of the second scan line and the plurality of overlapping sections as well as the plurality of extension sections of the second scan line, and has a plurality of via holes provided therein, each of which corresponds to a location of one of the extension sections, so that each of the extension sections is electrically connected to one non-overlapping section through a via hole, and accordingly, each overlapping section in the second scan line is electrically connected to a non-overlapping section adjacent to the overlapping section.

7. The array substrate claimed as claim 5, further comprising a gate insulating layer and a passivation layer, wherein the gate insulating layer is disposed between the first scan line as well as the plurality of non-overlapping sections of the second scan line and the plurality of overlapping sections as well as the plurality of extension sections of the second scan line, and has a plurality of via holes provided therein, each of the via holes is close to one extension section and corresponds to the location of a non-overlapping section close to the one extension section; the passivation layer covers the gate insulating layer, the plurality of extension sections and the plurality of overlapping sections of the second scan line and has a plurality of first via holes and a plurality of second via holes provided therein, each of the first via holes corresponds to the location of one via hole in the gate insulating layer, and each of the second via holes corresponds to the location of one extension section;
  a connection layer, which is located in a same layer as the pixel electrodes and is insulated from the pixel electrodes and which covers all of the first via holes and the second via holes in the passivation layer, and all via holes in the gate insulating layer, so that each of extension sections is electrically connected to one non-overlapping section through the connection layer, and thus each overlapping section in the second scan line is electrically connected to a non-overlapping section adjacent to the overlapping section through the connection layer, respectively.

8. The array substrate claimed as claim 5, wherein
each of the extension sections has one via hole provided thereon;
the array substrate further comprises:
a gate insulating layer and a passivation layer, wherein the gate insulating layer is disposed between the first scan line as well as the plurality of non-overlapping sections of the second scan line and the plurality of overlapping sections as well as the plurality of extension sections of the second scan line, and has a plurality of via holes provided therein, each of the via holes corresponds to the location of a via hole on one extension section; the passivation layer covers the gate insulating layer, the plurality of extension sections and the plurality of overlapping sections of the second scan line and has a plurality of via holes provided therein, each of the via holes corresponds to the location of a via hole on one extension section;
a connection layer, wherein the connection layer and the pixel electrode are located in a same layer and formed from the same film layer, and they are insulated from each other; the connection layer covers all of via holes in the passivation layer, via holes on all extension sections and all via holes in the gate insulating layer, so that each of extension sections is electrically connected to one non-overlapping section through the connection layer, and thus each overlapping section in the second scan line is electrically connected to a non-overlapping section adjacent to the overlapping section through the connection layer.

9. The array substrate claimed as claim 4, further comprising:
  a gate insulating layer and a passivation layer, wherein the gate insulating layer is disposed between the first scan line as well as the plurality of non-overlapping sections of the second scan line and the plurality of overlapping sections of the second scan line, and has a plurality of via holes provided therein, each of the via holes corresponds to the location of one end of one non-overlapping section that is close to an overlapping section adjacent to the non-overlapping section; the passivation layer covers the gate insulating layer and the plurality of overlapping sections of the second scan line, and has a plurality of first via holes and a plurality of second via holes provided therein, each of the first via holes corresponds to the location of one via hole in the gate insulating layer, and each of the second via holes corresponds to the location of one end of one overlapping section that is close to a non-overlapping section adjacent to the overlapping section;
a connection layer, wherein the connection layer and the pixel electrodes are located in a same layer and are insulated from each other; the connection layer covers all of the first via holes and the second via holes in the passivation layer, and all via holes in the gate insulating layer, so that each overlapping section in the second scan line is electrically connected to one non-overlapping section adjacent to the overlapping section through the connection layer.

10. The array substrate claimed as claim 1, wherein
the overlapping section and the pixel electrodes are located in a same layer, the overlapping section is one in number and its length is the same as a length of the first scan line; the non-overlapping section is in plurality, and each of non-overlapping sections is electrically connected to a gate electrode of one thin film transistor corresponding to the second scan line, the overlapping section in the second scan line is electrically connected to all of the non-overlapping sections simultaneously.

11. The array substrate claimed as claim 10, wherein
the second scan line further comprises a plurality of extension sections, each of which is a portion that extends from the overlapping section to overlap with one non-overlapping section adjacent to it, and a number of the extension sections is twice as many as a number of the non-overlapping sections;
the array substrate further comprises a gate insulating layer and a passivation layer; the gate insulating layer covers the first scan line and a plurality of non-overlapping sections of the second scan line, and has a plurality of via holes provided therein, each of which corresponds to the location of one extension section; the passivation layer covers the gate insulating layer and has a plurality of via holes provided therein, each of which corresponds to the location of one via hole in the gate insulating layer; both the overlapping section and the plurality of extension sections are disposed on the passivation layer, so that each of the extension sections is electrically connected to one non-overlapping section, and thus, the overlapping section in the second scan line is electrically connected to non-overlapping sections adjacent to the overlapping section.

12. A display device, comprising the pixel structure claimed as claim 1.

* * * * *